United States Patent
Engelen et al.

(10) Patent No.: US 10,998,298 B2
(45) Date of Patent: May 4, 2021

(54) LED ARRAY MODULE

(71) Applicant: Lumileds LLC, San Jose, CA (US)

(72) Inventors: Rob Jacques Paul Engelen, Eindhoven (NL); Frans Hubert Konijn, Eindhoven (NL); Charles André Schrama, San Jose, CA (US); Emanuel Nicolaas Hermanus Johannes Stassar, Sprang Capelle (NL); Erno Fancsali, Heusden-Zolder (BE); Varun Dev Kakkar, Eindhoven (NL); Nicola Bettina Pfeffer, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/472,545

(22) PCT Filed: Dec. 13, 2017

(86) PCT No.: PCT/EP2017/082635
§ 371 (c)(1),
(2) Date: Jun. 21, 2019

(87) PCT Pub. No.: WO2018/114527
PCT Pub. Date: Jun. 28, 2018

(65) Prior Publication Data
US 2019/0319019 A1 Oct. 17, 2019

Related U.S. Application Data (60) Provisional application No. 62/437,454, filed on Dec. 21, 2016.

(30) Foreign Application Priority Data

Jan. 9, 2017 (EP) .................................... 17150666

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/505* (2013.01); *H01L 33/06* (2013.01);
(Continued)

(58) Field of Classification Search
CPC ... H01L 25/0753; H01L 33/505; H01L 33/06; H01L 33/32; H01L 33/502; H01L 33/62; H01L 33/50
See application file for complete search history.

(56) References Cited

U.S. PATENT DOCUMENTS

2004/0217364 A1 11/2004 Tarsa et al.
2009/0046453 A1 2/2009 Kramer
(Continued)

FOREIGN PATENT DOCUMENTS

WO WO-2018114527 A1 6/2018

OTHER PUBLICATIONS

CREE. LED Color Mixing: Basics and Background, pp. 1-23 (Year: 2010).*
(Continued)

*Primary Examiner* — Galina G Yushina
(74) *Attorney, Agent, or Firm* — Schwegman Lundberg & Woessner, P.A.

(57) ABSTRACT

A light emitting diode array module includes a plurality of light emitting diode structures. The light emitting diode structures are arranged such that there is an optical cross talk between the light emitting diode structures during operation of the light emitting diode array module. At least a first light emitting diode structure of the plurality of light emitting diode structures is characterized by a first color. At least a
(Continued)

second light emitting diode structure of the plurality of light emitting diode structures is characterized by a second color different than the first color. The first color, the second color, and the optical cross talk between the light emitting diodes are arranged to provide a predefined light distribution in a reference plane perpendicular to an optical axis of the light emitting diode array module. A lighting device can include one or more LED array modules.

11 Claims, 5 Drawing Sheets

(51) Int. Cl.
  *H01L 33/06* (2010.01)
  *H01L 33/32* (2010.01)
  *H01L 33/62* (2010.01)
(52) U.S. Cl.
  CPC ............ *H01L 33/32* (2013.01); *H01L 33/502* (2013.01); *H01L 33/62* (2013.01)

(56) References Cited

U.S. PATENT DOCUMENTS

| | | |
|---|---|---|
| 2010/0315012 A1 | 12/2010 | Kim et al. |
| 2011/0170289 A1 | 7/2011 | Allen et al. |
| 2011/0204805 A1* | 8/2011 | Li .................... H05B 45/37 315/210 |
| 2012/0087127 A1* | 4/2012 | Veerasamy ....... G02F 1/133608 362/249.02 |
| 2012/0106145 A1 | 5/2012 | Kretschmann et al. |
| 2012/0287117 A1* | 11/2012 | Weber ............... G02F 1/133621 345/419 |
| 2016/0282578 A1* | 9/2016 | Childers .............. G02B 6/0001 |
| 2017/0184944 A1* | 6/2017 | Butterworth ........... G03B 15/00 |

OTHER PUBLICATIONS

"International Application Serial No. PCT/EP2017/082635, International Search Report dated Mar. 15, 2018", 4 pgs.
"International Application Serial No. PCT/EP2017/082635, Written Opinion dated Mar. 15, 2018", 8 pgs.

\* cited by examiner

LED ARRAY MODULE

PRIORITY APPLICATIONS

This application is a U.S. National Stage Filing under 35 U.S.C. 371 from International Application No. PCT/EP2017/082635, filed on Dec. 13, 2017, and published as WO 2018/114527, which claimed priority to European Patent Application No. 17150666.0, filed on Jan. 9, 2017, and U.S. Patent Application No. 62/437,454, filed on Dec. 21, 2016, all of which are incorporated herein by reference in their entireties.

TECHNICAL FIELD OF THE INVENTION

The disclosed subject matter relates to a light emitting diode (LED) array module.

BACKGROUND

The human eye is very sensitive with respect to variations in a light distribution or illumination pattern provided by a light source. Homogeneity of the correlated color temperature of the light distribution provided by a lighting module is therefore an important quality criterion. Especially lighting modules comprising a multitude of light emitters like light emitting diode (LED) structures require a careful selection of these LED structures in order to enable a homogeneous distribution of the color and especially of the correlated color temperature in a defined sector of the space illuminated by the lighting modules.

US 2012/0106145 A1 discloses an operating light which includes at least one first radiation source, which is suitable for producing light with locally different, especially radially outwardly decreasing color temperature distribution in a plane extending at right angles to the work area.

SUMMARY

A light emitting diode (LED) array module can have an improved distribution of color, including the correlated color temperature.

According to a first aspect a light emitting diode (LED) array module is provided. The LED array module comprises a plurality of light emitting diode structures. The light emitting diode structures are arranged such that there is an optical cross talk between the light emitting diode structures during operation of the light emitting diode array module. At least a first light emitting diode structure of the plurality of light emitting diode structures is characterized by a first color or flux. At least a second light emitting diode structure of the plurality of light emitting diode structures is characterized by a second color different than the first color. The at least second light emitting diode structure of the plurality of light emitting diode structures may alternatively or in addition be characterized by a second flux different than the first flux. The first color or the first flux, the second color or the second flux and the optical cross talk between the light emitting diodes are arranged to provide a predefined light distribution and preferably a predefined color distribution in a reference plane perpendicular to an optical axis of the light emitting diode array module. The reference plane is arranged at a defined distance to the light emitting diode array module.

The color of one of the LED structures may be preferably be characterized by the color temperature, correlated color temperature and the like. Especially the correlated color temperature may be preferred to characterize a LED module emitting white light.

Classic high-power LED structures are simple surface emitting light sources. However, these structures are getting smaller as time progresses, which is mostly cost-driven. One of the features that are allowing for further cost-down is 5-sided emission. Where a conventional LED structure would only emit from the top, a 5-sided emitter would also emit from the sides.

Such novel emitters have advantages in cost, but also in design flexibility. One could for example envisage a close-packed array of these emitters to achieve a very high-density high-flux emitter array.

Because of the 5-sided emission, light exiting the side of an emitter has a reasonable chance of entering a neighboring LED. The light entering its neighbor will interact with the neighboring LED which can result in a change of color and/or a change of flux. Such a change may be caused by phosphor interaction in the second LED structure and/or absorption of light in the second LED structure.

An LED structure at the edge of an array will therefore be affected less than an LED structure in the middle of the array.

This may result in two effects. First, an array may produce a total flux and average color point that is different from the LEDs when used in isolation. Second, over the array, the flux and color may vary. Color variation over the array is unwanted as it may result in non-uniform spot lighting.

The LED array module described above avoids or at least reduces the problem of color (flux) variation by taking into account the influence of neighboring LED structures in the LED array module. The LED structures are characterized by different (e.g. first, second, third, fourth etc.) colors or correlated color temperatures and optionally first, second, third, fourth fluxes which are combined in a way that the interaction between the LED structures is taking into account in order to provide the predefined color point and optionally flux distribution. The predefined correlated color temperature distribution may, for example, be a homogeneous or uniform correlated color temperature distribution or it may be a non-uniform color point distribution (e.g. a cool white correlated color temperature in a center and a warm white correlated color temperature at a border of the light distribution provided by means of the LED array module).

The correlated colors or color temperature of the LED structures and/or the fluxes may be chosen based on the binning of the different LED structures. That means that LED structures with, for example, different correlated color temperatures and/or fluxes are arranged, wherein the difference of the correlated color temperatures and/or fluxes is caused by variations in the production process of the LED structures. Alternatively, LED structures with different semiconductor layers (e.g. composition of active layer) and/or different light conversion structure may be arranged in order to enable the predefined distribution of the color and especially the correlated color temperature and/or fluxes of the LED array module.

The first, second, third etc. color or correlated color temperature and/or fluxes of the LED structures refers to the color, or correlated color temperature of an isolated LED structure without any interaction with neighboring LED structures.

At least the first light emitting diode structure of the plurality of light emitting diode structures may be further characterized by a first flux. At least a third light emitting diode structure of the plurality of light emitting diode structures may be characterized by a third flux. The first flux, the third flux and the optical cross talk between the light emitting diodes may be arranged to provide the predefined light distribution in the reference plane. The third LED structure may be the same as the second LED structure or a different LED structure. The third LED structure may be further characterized by a third color or correlated color temperature different than the first and/or second color or correlated color temperature.

The predefined light distribution may comprise a predefined color point temperature distribution. The first correlated color temperature and the second correlated color temperature may be arranged to at least partly compensate the optical cross talk between the light emitting diode structures such that a homogeneity of the predefined color point temperature distribution is increased.

The optical cross talk between the LED structures may cause an unintended shift of the correlated color temperature of neighboring LED structures. This unintended shift may be compensated by providing 2, 3, 4 or more LED structures with different correlated color temperatures.

The light emitting diode structures may be arranged to emit primary light and secondary light. The primary light is characterized by a first center wavelength in a first wavelength range. The secondary light is characterized by a second center wavelength in a second wavelength range. The second wavelength range is in a longer wavelength range than the first wavelength range. The at least first correlated color temperature and the at least second correlated color temperature are determined based on a probability that a light emitting diode structure receives primary light from one or more light emitting diode structures encompassing the light emitting diode structure.

The probability may be determined based on a number of the light emitting diode structures encompassing the light emitting diode structure.

The probability may alternatively or in addition be determined based on a distance between the light emitting diode structures encompassing the light emitting diode structure and the light emitting diode structure.

The probability may alternatively or in addition be determined based on a relative position of the light emitting diode structures encompassing the light emitting diode structure with respect to the light emitting diode structure.

The probability of receiving light and especially primary or secondary light is in general determined by the illumination pattern of each single LED structure and the geometric arrangement of the LED structures within the LED array module. Symmetry of the LED structures within the LED array module, varying distances lengths of common border between neighboring LED structures influence the probability that, for example, primary light is received by a light conversion structure of a neighboring (encompassing) LED structure. Furthermore, the arrangement of the LED structures may influence emission of secondary light which may be emitted after conversion of primary light received from a neighboring LED structure. In addition there may be optical structures especially at the border of a LED array module which may be arranged to reflect, for example, primary light emitted by LED structures at the border back to the emitting LED structure or a neighboring LED structure of the emitting LED structure. The optical structure or structures may especially be arranged to approximately mimic a neighboring LED. The optical structure may have in this case the effect that, for example, primary light emitted by a LED structure is reflected such that it appears for the emitting LED structure and neighboring LED structures that there is one or more LED structure at the position of the optical structure. The optical structure or structures provide a kind of image of the LED structures at the border of the LED array module.

A correlated color temperature of the light emitting diode structure encompassed by the light emitting structures may be higher the higher the probability of receiving primary light from the encompassing light emitting diode structures is.

The probability of receiving, for example, primary light from LED structures by means of a light conversion structure (e.g. phosphor layer) and the probability of conversion of this primary light to secondary light determine the amount of additional secondary light which is emitted by the light conversion structure of the respective LED structure. It may therefore be necessary to shift the correlated color temperature of an LED structure with a high probability of emitting additional secondary light based on the primary light received from encompassing LED structures to higher correlated color temperatures. The higher correlated color temperature may be chosen such that the ratio between primary light and secondary light emitted by the LED structure encompassed by the other LED structures is essentially the same as a ratio of the primary light and secondary light emitted by the encompassing LED structures (taking into account the cross talk between all neighboring LED structures).

The predefined correlated color temperature distribution may be flat within a defined distance from the optical axis. The first, second, third, fourth or more different correlated color temperatures of the LED structures may be used to extend the sector of uniform correlated color temperature of a lighting pattern provided by a LED array structure. The predefined correlated color temperature distribution may in this case be flat in the reference plane around the optical axis. The different (lower) correlated color temperature of LED structures at the border of the array may extend the distance from the optical axis in the reference plane in which the predefined correlated color temperature distribution is flat.

The light emitting diode array module may comprise a multitude of light emitting diode structures arranged in a regular pattern. The regular pattern of light emitting diode structures comprises a central area and a border area. A correlated color temperature of light emitting diode structures comprised by the border area is arranged to at least partly compensate the optical cross talk in accordance with a correlated color temperature distribution provided by light emitting diode structures comprised by the central area.

The light emitting structures of the LED array module may be characterized by, for example sub arrays with different emission characteristics. The correlated color temperature of the LED array module in the central area may, for example, be determined by the intensity provided by the different sub arrays of LED structures. LED structures comprised by the border area of the LED array module are characterized by different correlated color temperatures of the respective sub array in comparison to the central area in order to compensate changes of the correlated color temperature caused by varying optical cross talk caused by the geometric arrangement of encompassing LED structures as described above.

According to a further aspect a lighting device is provided. The lighting device comprises one, two, three or more light emitting diode array modules as described above. The lighting device further comprises at least one optical device being arranged to distribute light emitted by the at least one light emitting diode array module. The optical device may be a single lens or a complex arrangement of lenses, apertures and the like.

According to a further aspect a method of emitting light with a homogeneous color point distribution by means of a light emitting diode array module comprising a plurality of light emitting diode structures is provided. The method comprises the steps of:

emitting light of a first correlated color temperature by means of at least a first light emitting diode structure of the plurality of light emitting diode structures such that there is an optical cross talk with at least a second light emitting diode structure, emitting light of a second correlated color temperature different than the first correlated color temperature by means of at least the second light emitting diode structure of the plurality of light emitting diode structures such that there is an optical cross talk with at least the first light emitting diode structure, wherein the first correlated color temperature and the second correlated color temperature are arranged to at least partly compensate the optical cross talk between the light emitting diode structures such that a homogeneity of a predefined correlated color temperature distribution in a reference plane perpendicular to an optical axis of the light emitting diode array module is increased.

DETAILED DESCRIPTION

Figure 1:
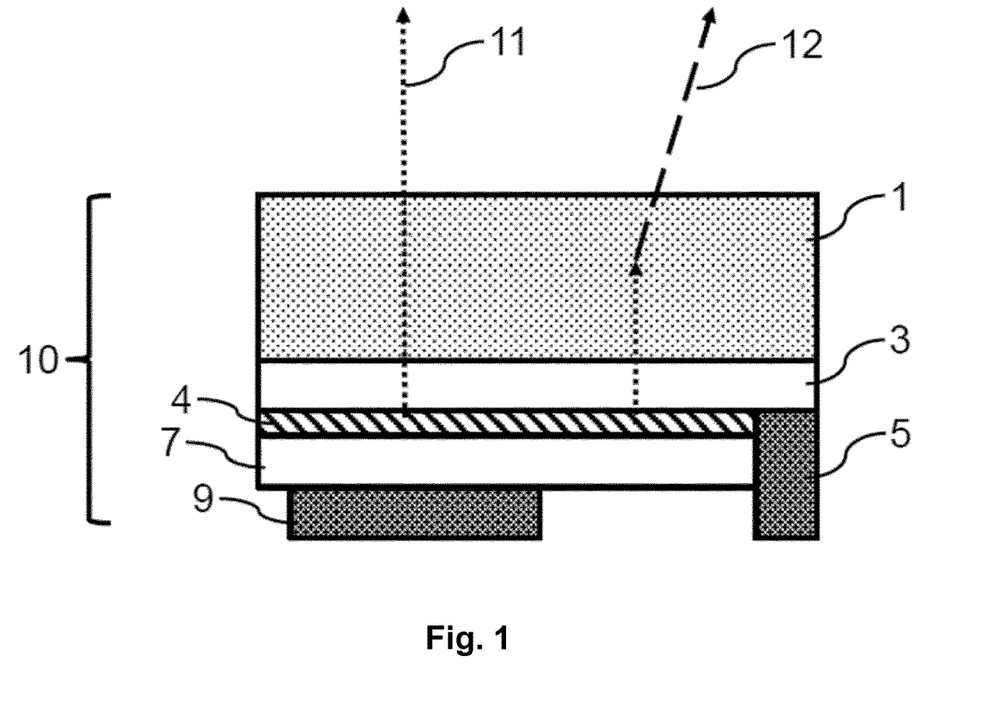
FIG. 1 shows a principal sketch of a light emitting diode structure

FIG. 1 shows a principal sketch of a cross-section of a light emitting diode (LED) structure 10. The LED structure 10 comprises a n-layer 3 which can be electrically contacted by means of n-contact 5. The n-layer 3 is followed by active layer 4. The active layer 4 may comprise a Quantum Well structure which is arranged to emit light with a wavelength which is determined by the composition of the active layer (e.g., AlInGaN). The active layer 4 is embedded or sandwiched between the n-layer 3 and a p-layer 7. The p-layer 7 can be electrically contacted by means of p-contact 9. The arrangement of n-layer 3, active layer 4, p-layer 9, n-contact 5 and p-contact 9 build a LED die. There may be further support layers which are not shown. A light conversion structure 1 is attached to a top surface of the n-layer 3 which is opposite to surface of the n-layer 3 attached to the active layer 4. The top surface of the n-layer 3 is the light emitting surface of the LED die. The light conversion structure 1 may comprise a phosphor like a Cerium doped phosphor garnet (YAG:Ce). The light conversion structure 1 is arranged to convert primary light 11 (e.g. blue light) emitted by the active layer 4 to secondary light 12 (e.g. yellow light) characterized by a longer wavelength than the primary light 11. A predefined part of the primary light 11 passes light conversion structure 1 without being converted such that the LED structure emits a mixture of primary light 11 and secondary light 12 (white light). The LED structure 10 is arranged to emit at least a major part of the light via a top surface and the side surfaces of the light conversion structure 1, wherein the top surface is opposite to the surface of the light conversion structure 1 which is attached to the n-layer 3. A LED structure 10 with a rectangular or quadratic cross-section perpendicular to the cross-section shown in FIG. 1 comprises therefore five light emission surfaces.

Alternatively, a kind of lid comprising the phosphor material may be arranged around the LED die of the LED structure 10 such that a mixture of primary and secondary light is emitted by means of different sides of the LED structure 10. Furthermore, the LED structure 10 may be embedded in a transparent light distribution structure which is arranged to emit light and essentially all directions of the semi-sphere in the direct direction of light emission of the LED structure 10.

Figure 2:
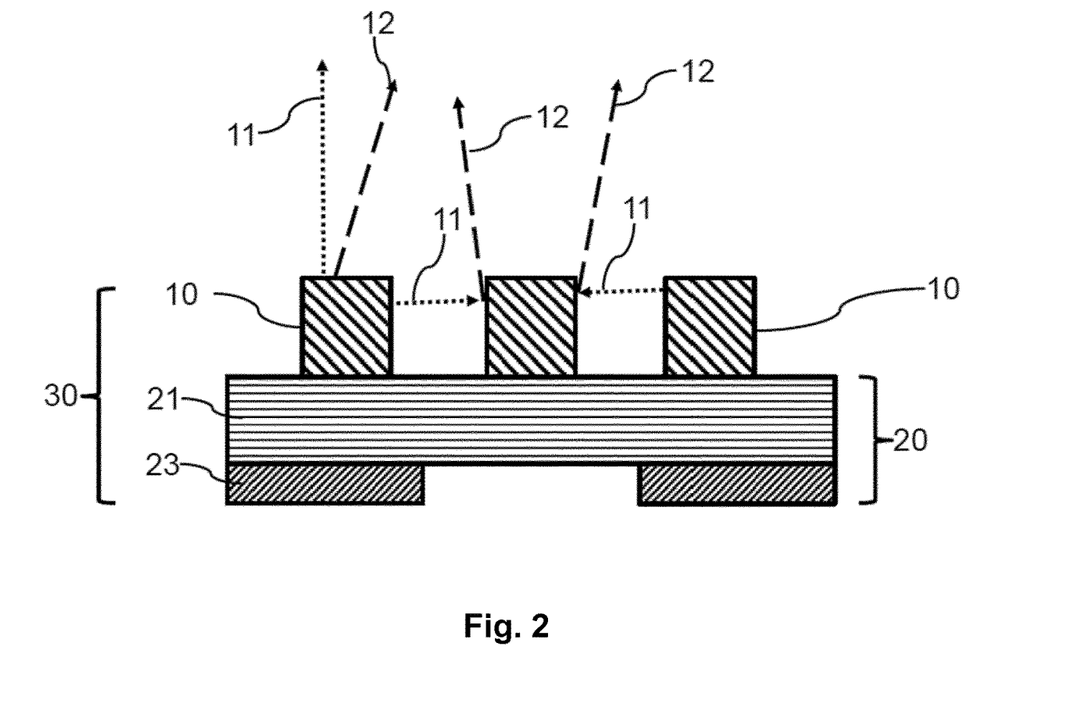
FIG. 2 shows a principal sketch of a light emitting diode array

FIG. 2 shows a principal sketch of a cross-section of a light emitting diode array 30. The light emitting diode array 30 comprises a number of LED structures 10 (three are shown in the cross-section) attached to a submount 20. The submount 20 comprises a submount chip 21 on which the LED structures 10 are mounted and electrical contact pads 23 by means of which the n-contacts and p-contacts (not shown) of the LED structures 10 can be electrically connected. The LED structures 10 emit primary (blue) light 11 and secondary (yellow) light 12. A part of the primary light 11 emitted by the left and the right LED structure 10 may hit the light conversion structure 1 of the LED structure 10 in the middle. The LED structure 10 in the middle therefore receives more primary light 11 from neighboring (or encompassing) LED structures 10 than the LED structures 10 at the left and at the right. The relative fraction of secondary light emitted from the light conversion structure 1 of the LED structure 10 in the middle is therefore increased. The correlated color temperature of the LED structure 10 in the middle seems therefore to be lower than the correlated color temperature of the LED structures on the left and the right side provided that all LED structures 10 are arranged to emit in a single arrangement, for example, white light of the same correlated color temperature. The same applies to the total flux emitted by the LED structures 10 because the LED 10 structure in the middle additionally receives more secondary light than the LED structures 10 on the left and the right side.

Figure 3:
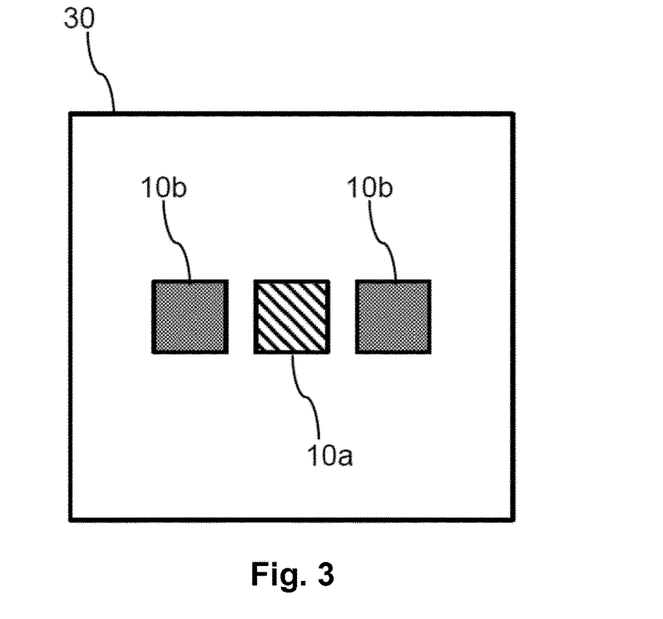
FIG. 3 shows a principal sketch of a first embodiment of a LED array module

FIG. 3 shows a principal sketch of a top view of a first embodiment of a LED array module 30. The LED array module 30 comprises three LED structures 10a, 10b which are arranged along an axis (linear array) in a similar way as described with respect to FIG. 2. A LED structure 10a is arranged between two LED structures 10b. The LED structure 10a in the middle emits white light with a higher first correlated color temperature in order to compensate a color shift caused by primary light emitted by the two adjacent LED structures 10b emitting white light with a lower second correlated color temperature in comparison to the first correlated color temperature. The second correlated color temperature is chosen such that the amount of additional converted secondary light 12 (see FIG. 2) caused by primary light received by the light conversion structure 1 of the LED structure 10*a* in the middle is essentially compensated. The correlated color temperature distribution of the light emitting module 30 is therefore more homogeneous or uniform along the axis of the linear array. It is clear that the selection of the first and the second correlated color temperature is determined by the geometric boundary conditions such that a perfect compensation is not possible. The same principal may be used in order to compensate variations of the flux caused by the optical cross talk between neighboring LED structures 10. The flux of the LED structures 10*b* at the left and the right may, for example, be higher than the optical flux of LED structure 10*a* in the middle in order to improve homogeneity of the flux of LED array module 30.

Figure 4:
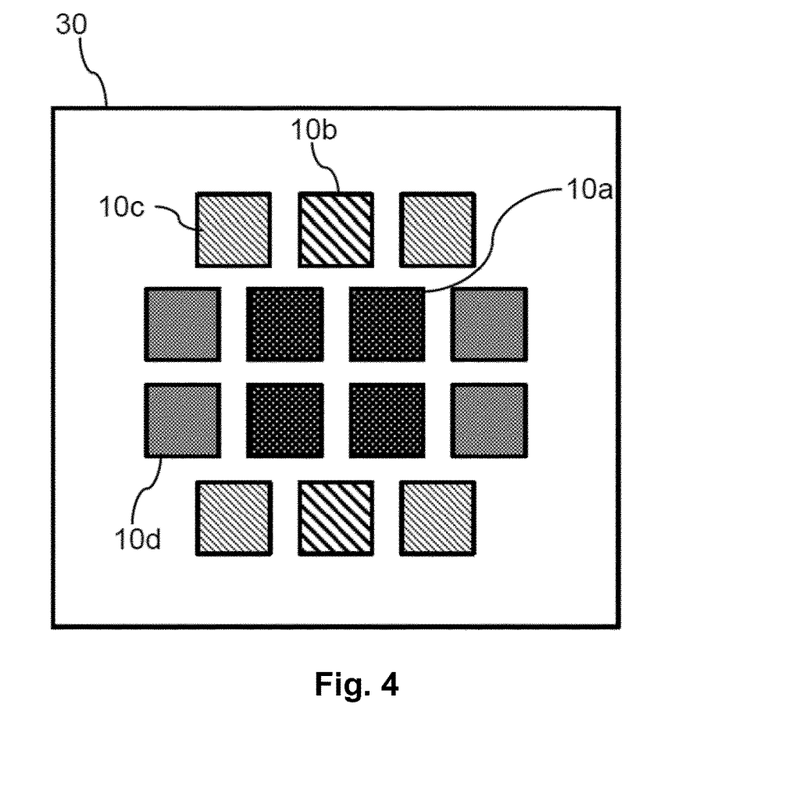
FIG. 4 shows a principal sketch of a second embodiment of the LED array module

FIG. 4 shows a principal sketch of a top view of a second embodiment of the LED array module 30. The LED array module 30 comprises a symmetric arrangement of LED structures 10*a*, 10*b*, 10*c*, 10*d*. The LED array module 30 comprises two symmetry axes both crossing a center point of the LED array module 30. Symmetry with respect to the first symmetry axis is in this case different than the symmetry with respect to the second symmetry axis. The LED structures 10*a*, 10*b*, 10*c*, 10*d* are arranged such that four LED structures 10*a* with a first correlated color temperature are arranged in the middle of the LED array module 30. The four LED structures 10*a* are encompassed by 10 LED structures 10*b*, 10*c*, 10*d*. The correlated color temperatures of the LED structures 10*b*, 10*c*, 10*d* is selected based on the relative position to neighboring LED structures 10*a*, 10*b*, 10*c*, 10*d*, the number of neighboring LED structures 10*a*, 10*b*, 10*c*, 10*d* and the distance(s) (the distances may, for example, be different in different directions) between the neighboring LED structures 10*a*, 10*b*, 10*c*, 10*d*. The geometry of the arrangement of the LED structures 10*a*, 10*b*, 10*c*, 10*d* in the LED array 30 determines a probability of receiving primary light from neighboring LED structures 10*a*, 10*b*, 10*c*, 10*d*. The nearer the distance, the more neighboring LED structures 10*a*, 10*b*, 10*c*, 10*d* encompass the respective LED structure 10*a*, 10*b*, 10*c*, 10*d* the higher is the probability to receive primary light from neighboring LED structures 10*a*, 10*b*, 10*c*, 10*d*. The correlated color temperature of the four LED structures 10*a* in the middle is therefore the highest. It is intended to provide an essentially uniform correlated color temperature distribution across the LED array module 30 because each of the four LED structures 10*a* is encompassed by seven other LED structures 10*a*, 10*b*, 10*c*, 10*d*. The second correlated color temperature of LED structures 10*b* is lower than the correlated color temperature of the LED structures 10*a* in the center but higher than the correlated color temperatures of LED structures 10*c*, 10*b* because four LED structures 10*a*, 10*c*, 10*d* encompass LED structures 10*b* such that three sides of LED structure have overlap with sides of the encompassing LED structures 10*a*, 10*c*, 10*d*. The LED structures 10*d* have a lower correlated color temperature than LED structures 10*b* but at a higher correlated color temperature than LED structure 10*c* being characterized by the lowest correlated color temperature of the LED array module 30.

Figure 5:
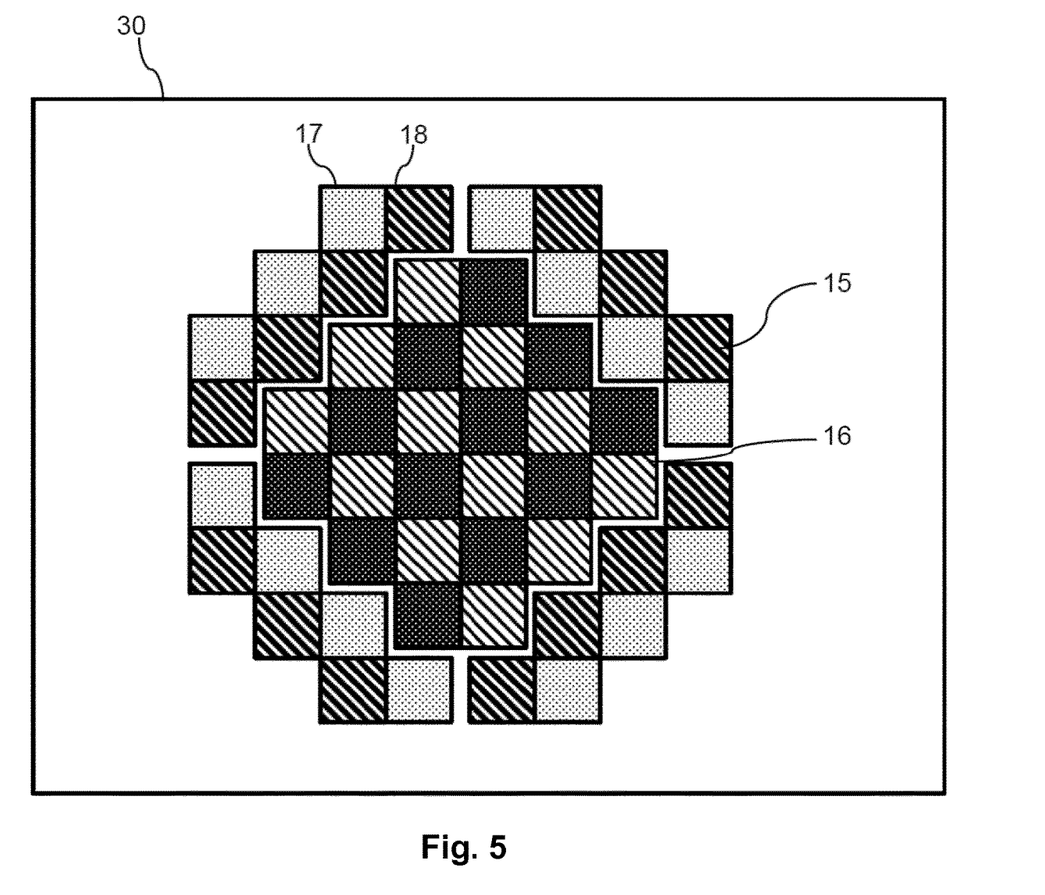
FIG. 5 shows a principal sketch of a third embodiment of the LED array module

FIG. 5 shows a principal sketch of a top view of a third embodiment of the LED array module 30. LED array module 30 comprises in this case two sub arrays of LED structures, which are arranged in a checkerboard pattern. The LED structures 17 of the first sub array (bright squares) are arranged to emit light of a first characteristic. The LED structures of the second sub array (dark squares) are arranged to emit light of a second characteristic. Each sub array 17, 18 can be controlled independently from the other sub array. The LED structures 17 of the first sub array may, for example, be arranged to emit light with a first color (e.g. blue). The LED structures 18 of the second sub array may, for example, be arranged to emit light with a second color (e.g yellow). The color of the light emitted by the LED array module 30 can therefore be controlled by means of the relative intensities provided by the two sub arrays. The general problem as discussed with respect to FIGS. 2, 3 and 4 remains the same. The LED array module 30 comprises a central area 16 wherein the LED structures 17, 18 of the central area 16 are each encompassed by the same number and kind of LED structures 17, 18. The LED array module 30 further comprises a border area 15 in which the number of encompassing LED structures 17, 18 depends on the position within the border area 15. The color of the LED structures 17, 18 of the border area 15 are therefore different than the color of the LED structures 17, 18 of the corresponding central area 16 in order to compensate the different optical crosstalk between the LED structures 17, 18. The color of the LED structures 17, 18 of the border area 15 essentially depends on the number of LED structures 17, 18 encompassing the respective LED structure 17, 18. The area of the LED array module 13 appearing to emit light of the same color and correlated color temperature is thus increased. The border area 15 and the central area 16 are separated by a small gap in FIG. 5 in order to simplify identification of LED structures 17, 18 of the central area 16 and the border area 15. There is no such a gap in the real LED array module 30.

Figure 6:
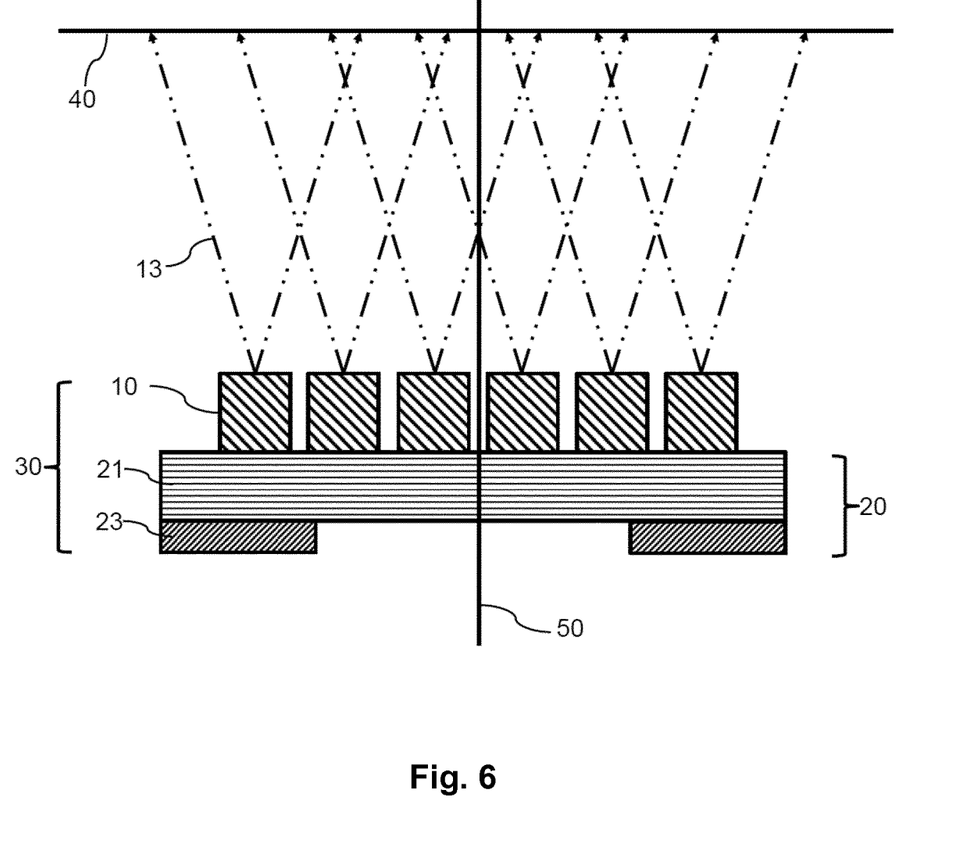
FIG. 6 shows a principal sketch of a cross-section of a fourth embodiment of the LED array module

FIG. 6 shows a principal sketch of a cross-section of a fourth embodiment of the LED array module 30. The LED array module comprises an array of 5×6 LED structures 10. The cross section shows six LED structures 10 in the third of the five lines of LED structures 10 which are arranged in a regular quadratic pattern. The LED structures 10 are attached to a submount 20 comprising a submount chip 21 and electrical contact pads 23 as discussed with respect to FIG. 2. The LED array module 30 comprises an optical axis 50 which is arranged in the middle of the 5×6 LED structures 10. Each of the LED structures 10 emits mixed light 13 comprising primary light 11 and secondary light 12 as discussed with respect to FIG. 2. The mixed light 13 overlaps in reference plane 40 which may, for example, be arranged in a distance preferably between 5 mm and 10 mm in order to detect the impact of the LED structures 10 comprised by the LED module 30. The correlated color temperature of the LED structures 10 of the central area of the LED array module 30 is higher in comparison to the correlated color temperature of the LED structures 10 of the border area of the LED array module 30. The LED structures 10 at the four corners of the LED array module 30 are characterized by the lowest correlated color temperature because these LED structures 10 are encompassed by the lowest number of encompassing LED structures 10.

Figure 7:
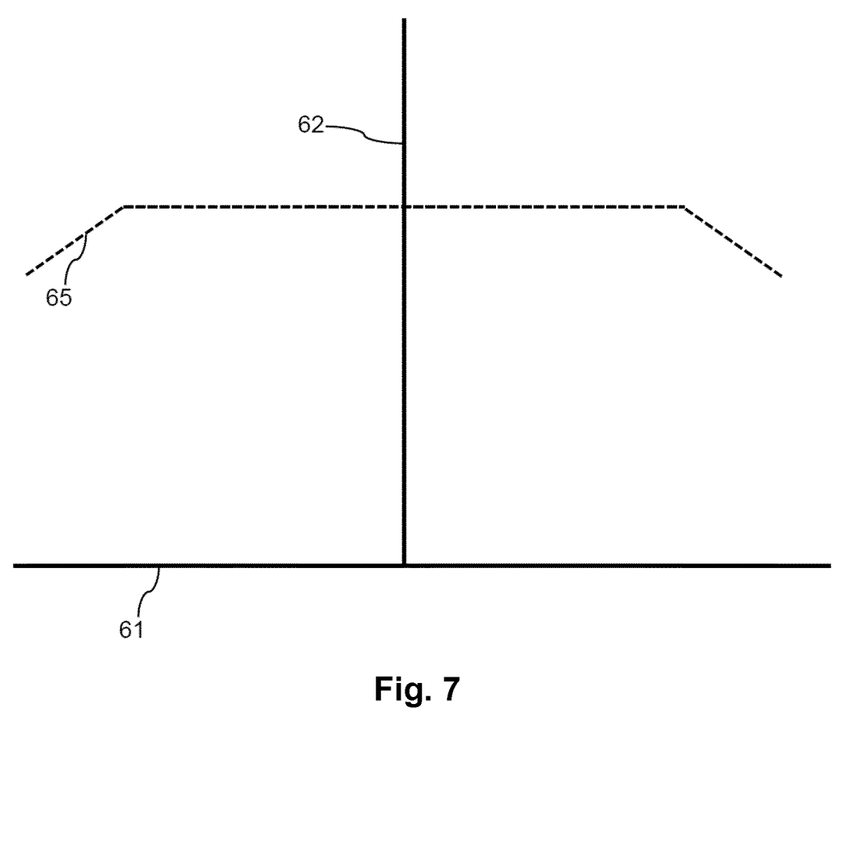
FIG. 7 shows an example of a predefined correlated color temperature distribution In the Figures, like numbers refer to like objects throughout. Objects in the Figures are not necessarily drawn to scale.

FIG. 7 shows the predefined correlated color temperature distribution 65 of the LED array module 30 shown in FIG. 6 along an axis of reference plane 40. The axis crosses the optical axis 50 and is arranged along the line defined by the LED structures 10 shown in FIG. 6. The abscissa 61 shows the distance to the optical axis 50 in the reference plane 40 and the ordinate 62 shows the correlated color temperature along the axis in the reference plane 40. The predefined correlated color temperature distribution 65 is essentially constant or flat within a predefined range around the optical axis 50 in the reference plane 40. The predefined range within the reference plane 40 is determined by the illumination pattern provided by each LED structure 10, the geometric orientation of the LED structures 10 within the LED array module 30 and the compensation of the optical cross talk by means of the different correlated color temperature of LED structures 10 in the border area of the LED array module 30.

Although the disclosure mainly speaks of correlated color temperature to describe the color of LED structures 10, other colors of a black body radiator can also be used, including color compensation in the full color space. Typically, the colors mentioned in the disclosure will be along the phosphor load line(s), i.e. the colors one can create by changing the concentration of phosphor in light conversion structure 1 of the corresponding LED structure 10.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 1 light conversion structure
3 n-layer
4 active layer
5 n-contact
7 p-layer
9 p-contact
10 light emitting diode (LED) structure
10a LED structure with first correlated color temperature
10b LED structure with second correlated color temperature
10c LED structure with third correlated color temperature
10d LED structure with fourth correlated color temperature
11 primary light
12 secondary light
13 mixed light
15 light emitting diode structure of border area
16 light emitting diode structure of central area
17 LED structure of first sub array
18 LED structure of second sub array
20 submount
21 submount chip
23 electrical contact pads
30 light emitting diode (LED) array module
40 reference plane
50 optical axis
61 distance to optical axis in reference plane
62 correlated color temperature in reference plane
65 correlated color temperature distribution in reference plane

The invention claimed is:

1. An apparatus, comprising:
an array of light emitting diodes (LEDs),
each LED of the array being configured to produce a primary light having a first wavelength;
each LED of the array containing a phosphor configured to absorb at least a portion of the primary light that strikes the phosphor and, in response to said absorption, to emit a secondary light having a wavelength longer than the first wavelength,
each LED of the array configured to emit an emitted light that is a combination of the primary light and the secondary light,
the emitted light having a correlated color temperature dependent on a ratio of intensities of the primary light to the secondary light,
the array of LEDs configured such that at least some of the LEDs direct a portion of the emitted light from the array to adjacent LEDs as crosstalk light,
the LEDs in the array being distributed between a central group of LEDs and a border group of LEDs that surrounds the central group of LEDs,
the central group of LEDs configured to radiate a first mixed light onto a reference plane, the first mixed light including a mixture of primary light generated by the central group of LEDs, the first mixed light having a first intensity,
the border group of LEDs configured to radiate a second mixed light onto the reference plane, the second mixed light including a mixture of primary light generated by the border group of LEDs, the second mixed light having a second intensity that differs from the first intensity,
the array of LEDs configured to radiate a third mixed light onto the reference plane, the third mixed light including a mixture of primary light generated by all LEDs in the array, the third mixed light having a substantially predetermined correlated color temperature.

2. The apparatus of claim 1, wherein, for a first LED of the array of LEDs, an intensity of a crosstalk light received at the first LED is determined in part by a number of LEDs in the array that direct crosstalk light onto the first LED.

3. The apparatus of claim 1, wherein, for a first LED of the array of LEDs, an intensity of a crosstalk light received at the first LED is proportional to a number of LEDs in the array that direct crosstalk light onto the first LED.

4. The apparatus of claim 1, wherein the second intensity is greater than the first intensity.

5. The apparatus of claim 1, wherein:
the array of LEDs is a two-dimensional array;
each LED in the central group is fully surrounded by adjacent LEDs in the array of LEDs; and
each LED in the border group is only partially surrounded by adjacent LEDs in the array of LEDs.

6. The apparatus of claim 1, wherein:
the array of LEDs is a two-dimensional rectilinear array;
each LED in the central group is surrounded by four directly adjacent LEDs and four diagonally adjacent LEDs in the array of LEDs; and
each LED in the border group is surrounded by fewer than four directly adjacent LEDs or fewer than four diagonally adjacent LEDs in the array of LEDs.

7. The apparatus of claim 1, wherein:
the array of LEDs is a two-dimensional array that extends in a first plane that is generally parallel to the reference plane;
each LED in the array is configured to emit light from a first emission surface oriented generally parallel to the first plane and from at least one second emission surface oriented substantially orthogonal to the first emission surface; and the LEDs of the array are arranged such that the at least one second emission surface of an LED is positioned to receive light from a second emission surface of at least another LED in the array.

8. The apparatus of claim 7, wherein light emitted from a second emission surface of a first LED of the array is configured to interact with a phosphor of a second LED of the array.

9. The apparatus of claim 7, wherein light emitted from a second emission surface of a first LED of the array is configured to be absorbed by a second LED of the array.

10. An apparatus, comprising:

a two-dimensional rectilinear array of light emitting diodes (LEDs) that are configured to emit light and direct a portion of the emitted light to adjacent LEDs in the array as crosstalk lights, the LEDs in the array being distributed between a central group of LEDs and a border group of LEDs, each LED in the central group being surrounded by four directly adjacent LEDs and four diagonally adjacent LEDs in the array of LEDs, each LED in the border group being surrounded by fewer than four directly adjacent LEDs or fewer than four diagonally adjacent LEDs in the array of LEDs, the array of LEDs configured to emit a mixed light from all LEDs of the array that comprises primary lights of all LEDs and distribute the mixed light on a reference plane, the mixed light having a substantially predetermined correlated color temperature, the substantially predetermined correlated color temperature being dependent on primary lights intensity from the border group of LEDs and on primary lights intensity from the central group of LEDs, the primary lights intensity from the border group of LEDs being greater than the primary lights intensity from the central group of LEDs.

11. The apparatus of claim 10, wherein:

the array of LEDs is a two-dimensional array that extends in a first plane that is generally parallel to the reference plane;

each LED in the array is configured to emit light from a first emission surface oriented generally parallel to the first plane and from at least one second emission surface oriented substantially orthogonal to the first emission surface; and the LEDs are arranged in the array such that the at least one second emission surface of an LED in the array is positioned to receive light from a second emission surface of another LED in the array.

* * * * *